United States Patent
Yunogami et al.

(10) Patent No.: US 6,998,325 B2
(45) Date of Patent: Feb. 14, 2006

(54) METHOD FOR MANUFACTURING SEMICONDUCTOR DEVICE

(75) Inventors: Takashi Yunogami, Saitama (JP); Kaori Misawa, Gifu (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/980,279

(22) Filed: Nov. 4, 2004

(65) Prior Publication Data

US 2005/0101157 A1 May 12, 2005

(30) Foreign Application Priority Data

Nov. 10, 2003 (JP) ............................. 2003-379675

(51) Int. Cl.
*H01L 21/76* (2006.01)
(52) U.S. Cl. .................... 438/409; 438/660; 438/687; 438/692
(58) Field of Classification Search ................ 438/409, 438/270, 700, 680, 681, 43, 645, 648, 653, 438/660, 687, 692, 706
See application file for complete search history.

(56) References Cited

U.S. PATENT DOCUMENTS 6,596,467 B1 * 7/2003 Gallagher et al. .......... 430/314
6,818,285 B1 * 11/2004 Hedrick et al. ............. 428/209
6,831,366 B1 * 12/2004 Gates et al. ................ 257/760
2002/0074659 A1   6/2002 Dalton et al.
2003/0057414 A1   3/2003 Dalton et al.
2003/0157272 A1 * 8/2003 Tonai et al. ................ 427/600
2003/0218253 A1  11/2003 Avanzino et al.

FOREIGN PATENT DOCUMENTS

JP          11-330069       11/1999

* cited by examiner

*Primary Examiner*—David Nhu
(74) *Attorney, Agent, or Firm*—Leydig, Voit & Mayer, Ltd.

(57) ABSTRACT

An insulating-film composition containing an insulating-film precursor and a pore-generating material is applied onto a surface of a semiconductor substrate, and a first heat treatment is performed to polymerize the insulating-film precursor without vaporizing the pore-generating material, to form a non-porous insulating film. Next, a resist pattern is formed on the non-porous insulating film, and dry etching is performed, using the resist pattern as a mask, to form a trench in the non-porous insulating film. After removing the resist pattern by ashing, the surface of the semiconductor substrate is cleaned. Next, a second heat treatment is performed to remove the pore-generating material from the non-porous insulating film and to form a porous insulating film. Thereafter, a copper layer is deposited in the trench on a barrier-metal film to form copper wiring.

10 Claims, 8 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device, and more specifically to a method for manufacturing a semiconductor device using a porous low-dielectric-constant insulating film.

2. Background Art

With the miniaturization and high-speed operation of semiconductor devices in recent years, wiring structures have been more multi-layered. However, in such a trend, signal delay due to increase in wiring resistance and parasitic capacitance between wirings and between wiring layers causes problems. Since signal delay T is proportional to the product of wiring resistance R and parasitic capacitance C, the resistance of the wiring layer as well as parasitic capacitance must be lowered in order to minimize signal delay T.

In order to lower wiring resistance R, wiring materials having a low resistance must be used. Specifically, the shift from the conventional aluminum (Al) wiring to copper (Cu) wiring is considered.

On the other hand, the parasitic capacitance C between wiring layers has the relationship to the specific dielectric constant $\in$ of the interlayer insulating film formed between wiring layers, the distance d between the wiring layers, and the side-face area S of the wiring layer as $C=(\in \times S)/d$. Therefore, in order to lower the capacitance C, the dielectric constant of the interlayer insulating film must be lowered.

Examples of conventionally known interlayer insulating films include an SiOF film formed using a CVD (chemical vapor deposition) method. The specific dielectric constant of the SiOF film is about 3.3, which is lower than the specific dielectric constant of an $SiO_2$ film of about 3.9. However, if the specific dielectric constant must be further lowered, it is difficult to use the SiOF film practically because the stability of the film is insufficient.

Therefore, the application of SOG (spin on glass) films or organic polymer films to the interlayer insulating film has been examined. It has been known that the specific dielectric constant of these films can be lowered to about 1.9 if they are made porous (e.g., refer to Japanese Patent Laid-Open No. 11-330069).

A conventional method for forming a copper wiring using a porous low-dielectric-constant insulating film (porous low-k film) will be described referring to FIGS. 12 to 15. In there drawings, the parts denoted by the same reference numerals are the same parts.

First, as FIG. 12 shows, a porous insulating film 23 having pores 22 is formed on a semiconductor substrate 21. Next, a resist pattern 24 is formed on the porous insulating film 23 to form the structure shown in FIG. 13. Then, the porous insulating film 23 is subjected to dry etching using a resist pattern 24 as a mask to form a trench 25 for the copper wiring in the porous insulating film 23. After removing no longer required resist pattern 24 by ashing, cleaning is performed using a cleaning solution to form the structure shown in FIG. 14. Then, a barrier-metal film 26 is formed on the inner surface of the trench 25, and a copper layer 27 is buried. By the above-described steps, a copper wiring shown in FIG. 15 is formed.

However, the porous insulating film has the following problems due to the presence of pores. Specifically, in the above-described dry etching and ashing steps, the porous insulating film is easily undergone charging damage by plasma. Also in the cleaning step, the cleaning solution penetrates easily into the porous insulating film. Thereby, the characteristics of the porous insulating film as an interlayer insulating film is degraded, causing problems of the lowered electrical properties and the lowered reliability of the semiconductor device.

SUMMARY OF THE INVENTION

The object of the present invention is to solve the above-described problems. Specifically, the object of the present invention is to provide a method for manufacturing a semiconductor device that excels in electrical properties and reliability, using a porous insulating film.

According to one aspect of the present invention, in a method for manufacturing a semiconductor device, an insulating-film composition containing an insulating-film precursor and a pore-generating material (i.e. porogen) is applied onto a semiconductor substrate. A first heat treatment is performed to the insulating-film composition to polymerize the insulating-film precursor in the state wherein the pore-generating material is not vaporized, and to form a non-porous insulating film. A resist pattern is formed on the non-porous insulating film. The dry etching of the non-porous insulating film is performed using the resist pattern as a mask to form a trench in the non-porous insulating film. The resist pattern is removed by ashing. The surface of the semiconductor substrate is cleaned after the ashing. A second heat treatment is performed to the non-porous insulating film after the cleaning, to remove the pore-generating material from the non-porous insulating film, and to form a porous insulating film. A barrier-metal film is formed on the inner surface of the trench. A copper layer is buried in the trench through the barrier-metal film.

According to another aspect of the present invention, in a method for manufacturing a semiconductor device, an insulating-film compositi is applied on containing an insulating-film precursor and a pore-generating material onto a semiconductor substrate. A first heat treatment is performed to the insulating-film composition to polymerize the insulating-film precursor in the state wherein the pore-generating material is not vaporized, and to form a non-porous insulating film. A CMP stopper film is formed on the non-porous insulating film. A resist pattern is formed on the CMP stopper film. The dry etching of the CMP stopper film and the non-porous insulating film is performed using the resist pattern as a mask to form a trench in the non-porous insulating film. The resist pattern is removed by ashing. The surface of the semiconductor substrate is cleaned after said ashing. A second heat treatment is performed to the non-porous insulating film after the cleaning, to remove the pore-generating material from the non-porous insulating film, and to form a porous insulating film. A barrier-metal film is formed on the CMP stopper film and the inner surface of the trench. A copper layer is formed on the barrier-metal film so as to bury the trench. The copper layer and the barrier-metal film are polished using a CMP method to form a copper wiring.

Other objects and advantages of the present invention will become obvious from the following description.

DETAILED DESCRIPTION OF THE PREFERRED EMBODIMENTS

Figure 1:
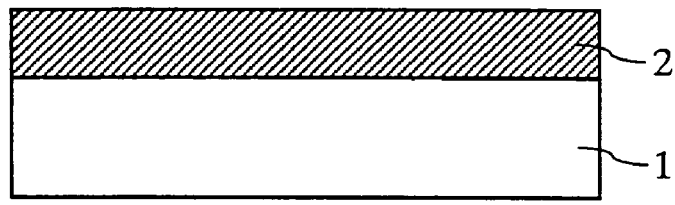
FIG. 1 is a sectional view showing a method for manufacturing a semiconductor device according to the embodiment.

A porous insulating film is formed, for example, by applying a polysiloxane resin composition containing a pore-generating material onto a semiconductor substrate, and performing heat treatment to the polysiloxane resin composition. By heat treatment, the curing reaction of polysiloxane proceeds, and the pore-generating material decomposes and vaporizes. Thereby, a large number of fine pores are formed in the insulating film.

However, if the decomposition of the pore-generating material becomes active before the completion of the curing reaction of polysiloxane, the size of formed pores becomes small, and porosity (pore forming rate) lowers. Therefore, when a polysiloxane resin composition is designed, the decomposition of the pore-generating material has been activated at a higher temperature than the curing temperature of polysiloxane.

The present inventors repeated examinations, and found that a semiconductor device that excels in electrical properties and reliability could be manufactured by forming a wiring trench when polysiloxane was cured, and thereafter performing heat treatment to vaporize and remove the pore-generating material. According to this method, the wiring trench is formed in the state wherein no pores are present in the interlayer insulating film. Therefore, in etching and ashing, the interlayer insulating film is not damaged by plasma charging, and the cleaning solution does not penetrate into the interlayer insulating film. Furthermore, since pores are formed by decomposing and vaporizing the pore-generating material after the completion of the step for forming the wiring trench, the interlayer insulating film having a low dielectric constant can be formed. Therefore, a semiconductor device that has a small parasitic capacitance between the wiring layers, and excels in electrical properties as well as reliability can be manufactured.

An embodiment of the present invention will be described below in further detail referring to the drawings, FIGS. 1 to 10 are sectional views showing a method for manufacturing a semiconductor device according to the embodiment. In these drawings, the parts denoted by the same reference numerals are the same parts.

First, as FIG. 1 shows, an insulating-film composition 2 to be an interlayer insulating film is applied onto a semiconductor substrate 1. As the semiconductor substrate 1, for example, a silicon substrate can be used. The insulating-film composition 2 can be applied using a spin-coating method or the like.

As the insulating-film composition 2, for example, a silica-based resin composition containing a pore-generating material can be used. Specifically, the insulating-film composition 2 may contain a precursor of an insulating film and a pore-generating material. The insulating-film composition 2 may also contain a suitable solvent.

The examples of porous insulating films applicable to the embodiment include porous films of $SiO_2$-based porous polysiloxane films, such as methyl silsesquioxane (MSQ) and hydrogenated silsesquioxane (HSQ); porous organic-inorganic hybrid films; and porous films consisting of polymers of aromatic compounds, such as polyimide derivatives, polyallylether derivatives, polyquinoline derivatives, and poly-p-xylene derivatives. Therefore, any precursors of these compounds can be used as the above-described precursors for the insulating film.

The examples of pore-generating materials applicable to the embodiment include vinyl ether compounds, vinyl pyridine compounds, styrene compounds, alkyl estervinyl compounds, acrylic acid compounds, methacrylic acid compounds and polymers comprising unit of alkylene oxide.

Figure 2:
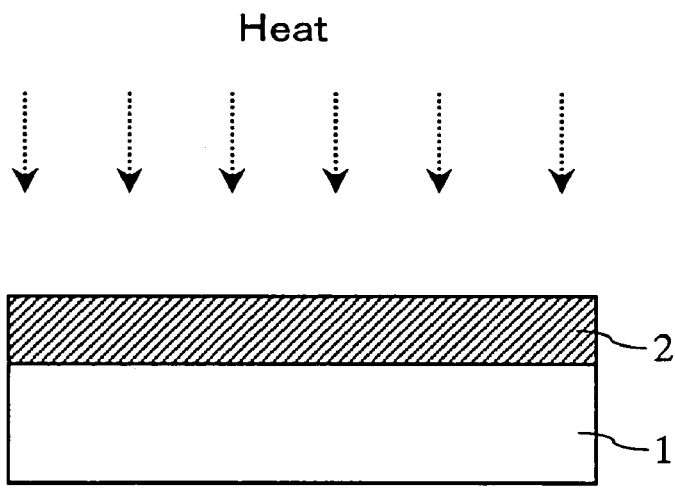
FIG. 2 is a sectional view showing a method for manufacturing a semiconductor device according to the embodiment.

Next, as FIG. 2 shows, a first heat treatment is performed to the insulating-film composition 2. The purpose of this heat treatment is to form a film by polymerizing the precursors for the insulating film contained in the insulating-film composition 2. Here, the temperature of the first heat treatment is a temperature not to vaporize the pore-generating material. In other words, the pore-generating material is made to retain in the film without being vaporized by the first heat treatment. In this case, although the temperature is preferably the decomposition temperature of the pore-generating material or below, the temperature may be the temperature at which the decomposition reaction of the pore-generating material starts or higher, if it is a temperature at which the decomposition product can retain in the film without being vaporized. Although the temperature of the first heat treatment can be optionally selected depending on the kinds of the precursors for the insulating film and the pore-generating material, specifically, a temperature of 350° C. or below is preferable. For example, the insulating-film composition 2 can be heated at 350° C. for about 2 minutes.

The first heat treatment is preferably performed in an inert-gas atmosphere for inhibiting the decomposition of the pore-generating material. As the inert gas, nitrogen ($N_2$), helium (He), or argon (Ar) can be used. In this case, the lower concentration of oxygen contained in the atmosphere is preferred, the decomposition of the pore-generating material can be sufficiently suppressed if the concentration of oxygen is 100 ppm or below.

The first heat treatment step is not limited to a step carried out in one stage, but may be carried out in two or more stages. For example, if the insulating-film composition 2 contains a solvent, after carrying out heat treatment aiming at the vaporization and removal of the solvent (Step 1), heat treatment for polymerizing the precursors for the insulating film to form a film (Step 2) may be carried out. In this case, the Step 2 heat treatment should be carried out at the temperature higher than the temperature of the Step 1 heat treatment.

Figure 3:
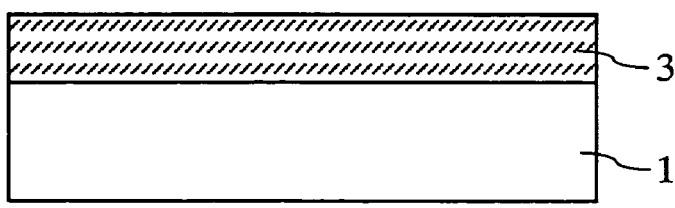
FIG. 3 is a sectional view showing a method for manufacturing a semiconductor device according to the embodiment.

By carrying out the first heat treatment, the insulating-film composition 2 is converted to a non-porous insulating film 3 (FIG. 3). Here, the non-porous insulating film 3 is a film containing a pore-generating material. In other words, the non-porous insulating film 3 is an interlayer insulating film in the state wherein no pores have been formed.

Figure 4:
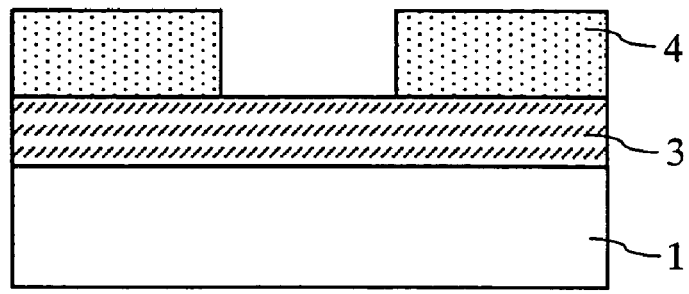
FIG. 4 is a sectional view showing a method for manufacturing a semiconductor device according to the embodiment.

Next, a resist pattern 4 is formed on the non-porous insulating film 3 to fabricate the structure shown in FIG. 4. Specifically, after applying a photo-resist (not shown) onto the non-porous insulating film 3, the photo-resist is exposed through a predetermined mask (not shown). Thereafter, the photo-resist is developed to form a resist pattern 4.

Figure 5:
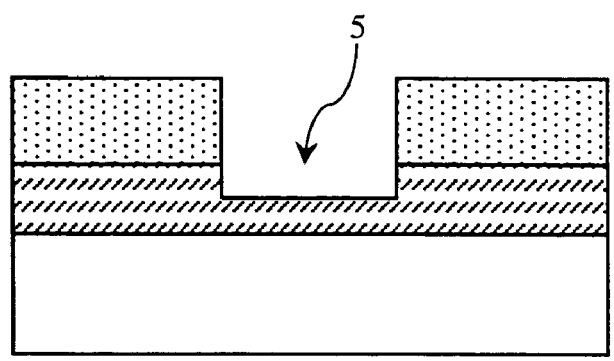
FIG. 5 is a sectional view showing a method for manufacturing a semiconductor device according to the embodiment.

Next, the non-porous insulating film 3 is subjected to dry etching to a predetermined depth using the resist pattern 4 as a mask. Thereby, a trench 5 for copper wiring is formed in the non-porous insulating film 3 as FIG. 5 shows.

Here, an example of the dry-etching apparatus is a dual-frequency exciting parallel-plate type reactive ion etching apparatus that can impress 60 MHz and 2 MHz radio frequencies to the upper and lower electrodes, respectively. Specifically, a mixed gas consisting of octafluorobutene ($C_4F_8$), nitrogen ($N_2$) and argon (Ar) is introduced in the apparatus as the etching gas, and in the state wherein the pressure is maintained at 150 mTorr, the RF power of 1,000 W and 1,400 W are impressed to the upper and lower electrodes, respectively, to generate plasma. At this time, the flow-rate ratio of the etching gas can be, for example, 10 sccm:225 sccm:1,400 sccm for octafluorobutene, nitrogen, and argon, respectively. The surface temperature of the stage for placing the substrate can be maintained at 25° C.

For etching the non-porous insulating film 3, a gas other than the above-described mixed gas can be used. For example, a mixed gas consisting of tetrafluoromethane ($CF_4$), difluoromethane ($CH_2F_2$), neon (Ne) and argon (Ar) can also be used.

After the trench 5 has been formed, the resist pattern 4 no longer required is removed by ashing. Here, an example of the ashing apparatus is a parallel-plate type reactive ion etching apparatus that can impress 13.56 MHz radio frequency to the lower electrode. Specifically, ammonia gas ($NH_3$) having a flow-rate of 300 sccm is introduced in the apparatus, and in the state wherein the pressure is maintained at 10 Pa, the RF power of 300 W is impressed to the lower electrode to generate plasma. At this time, the surface temperature of the stage for placing the substrate can be maintained at 25° C.

According to this embodiment, since dry etching and ashing steps are performed in the state wherein no pores have been formed in the interlayer insulating film, the phenomenon of charge accumulation in pores can be eliminated, and the charging damage of the interlayer insulating film can be prevented.

After the ashing of the resist pattern 4, the surface of the semiconductor substrate 1 is cleaned using an appropriate cleaning solution. Cleaning can be performed by ejecting the cleaning solution from the cleaning apparatus onto the semiconductor substrate 1. Thereby, the contaminants or the like adhered in dry etching and ashig steps can be removed. In this embodiment, since cleaning is performed in the state of a non-porous insulating film, that is, the state wherein no pores have been formed in the interlayer insulating film, the penetration of the cleaning solution into the interlayer insulating film, caused by the cleaning solution brought in the pores, can be prevented.

Figure 6:
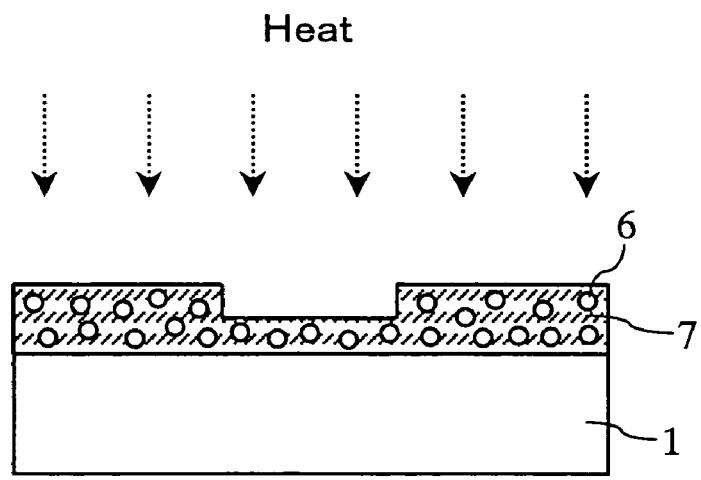
FIG. 6 is a sectional view showing a method for manufacturing a semiconductor device according to the embodiment.

After the trench 5 has been formed in the non-porous insulating film 3 using the above steps, the non-porous insulating film 3 is subjected to a second heat treatment. The purpose of this heat treatment is to actively decompose and vaporize the pore-generating material remaining in the non-porous insulating film 3. By vaporizing the pore-generating material, and extracting it from the resin matrix composing the non-porous insulating film 3, the non-porous insulating film 3 can be converted into a porous insulating film 7 having a large number of pores 6 (FIG. 6).

The second heat treatment step is carried out at a temperature higher than the temperature of the first heat treatment step (e.g., a high temperature of about 100° C.) that can decompose and vaporize the pore-generating material. From the point of view of actively decomposing and vaporizing the pore-generating material, it is more preferable that the temperature of the second heat treatment step is higher. In the other hand, from the point of view of the reliability of the copper wiring and the like, it is more preferable that the temperature of the second heat treatment step is lower. Specifically, the temperature of the second heat treatment step is preferably 450° C. or below, and is more preferably selected from a temperature of 450° C. or below depending on the kinds of the pore-generating material and the precursor of the insulating film. For example, the second heat treatment step can be carried out at 450° C. for 10 minutes.

The second heat treatment step may be carried out in an oxidizing-gas atmosphere. Heating in an oxidizing-gas atmosphere can accelerate the decomposition and vaporization of the pore-generating material, and can lower the heating temperature in this step. As the oxidizing gas, oxygen or oxygen-containing gas can be used. A gas containing oxygen and ozone, or oxygen and oxygen radicals may also be used.

In this embodiment, the first and second heat treatment steps can be carried out using a hot plate or a furnace.

The interlayer insulating film becomes porous by carrying out the second heat treatment step as FIG. 6 shows. Since the specific dielectric constant of the interlayer insulating film is lowered by the formation of pores, the parasitic capacitance can be lowered, and a semiconductor device that excels in electrical properties can be manufactured.

Figure 7:
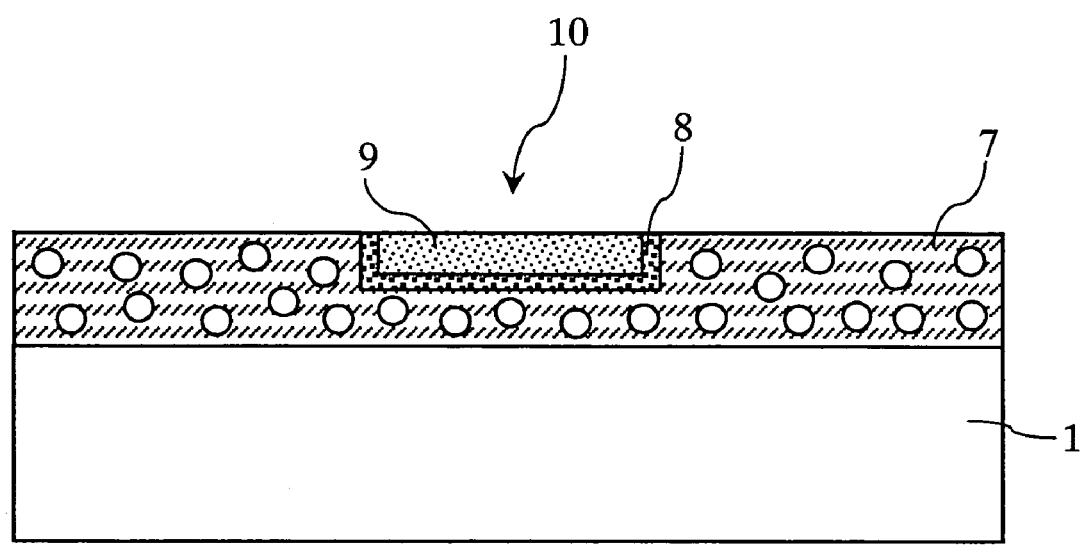
FIG. 7 is a sectional view showing a method for manufacturing a semiconductor device according to the embodiment.

After the second heat treatment step has been completed, a barrier-metal film 8 is formed on the inner surface of the trench 5, and a copper layer 9 is buried in the trench 5 through the barrier-metal film 8 to form the copper wiring 10 (FIG. 7). This step can be carried out as follows:

First, a barrier-metal film 8, such as a titanium nitride film or a tantalum nitride film, is formed on the porous insulating film 7 including the inner surface of the trench 5 using a CVD method or a sputtering method. Next, a copper layer 9 is formed on the barrier-metal film 8 so as to bury the trench 5. Then, the copper layer 9 and the barrier-metal film 8 are polished using a chemical-mechanical polishing method (hereafter referred to as CMP). Thereby, the copper layer 9 and the barrier-metal film 8 can be allowed to remain only in the trench 5.

The formation of the barrier-metal film 8 and the burying of the copper layer 9 may be performed using other methods. For example, after forming the barrier-metal film 8 only in the trench 5 using a CVD method and a CMP method, the copper layer 9 may be buried in the trench 5 by a plating method using an electrolyte consisting mainly of copper sulfate ($CuSO_4$).

Figure 8:
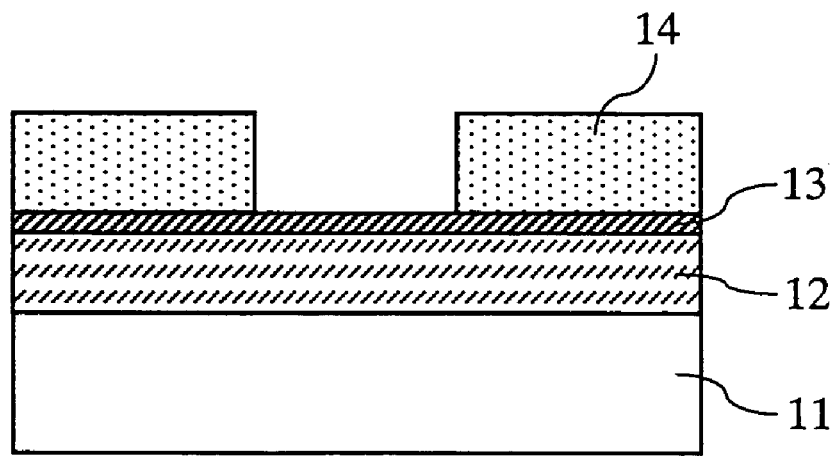
FIG. 8 is a sectional view showing a method for manufacturing a semiconductor device according to the embodiment.
Figure 9:
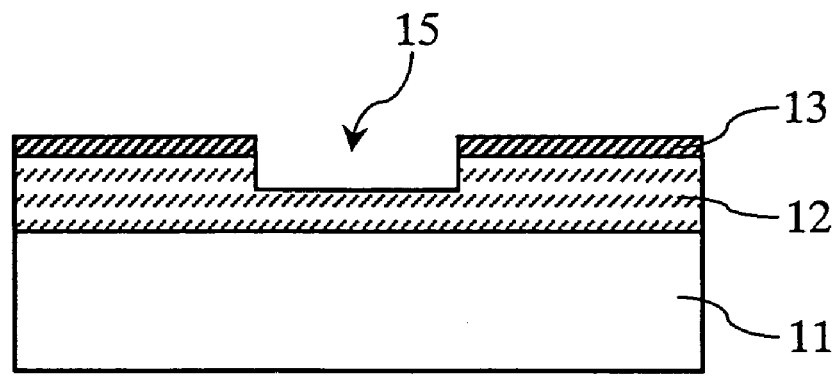
FIG. 9 is a sectional view showing a method for manufacturing a semiconductor device according to the embodiment.

In this embodiment, although a resist pattern is formed on a non-porous insulating film, the present invention is not limited thereto. For example, as FIG. 8 shows, a resist pattern 14 may be formed after forming a CMP stopper film 13 on a non-porous insulating film 12 formed on a semiconductor substrate 11. In this case, after forming a trench 15 in the non-porous insulating film 12 by dry etching of the CMP stopper film 13 and the non-porous insulating film 12 using the resist pattern 14 as a mask, the resist pattern 14 no longer required is removed by ashing to form the structure as shown in FIG. 9.

Figure 10:
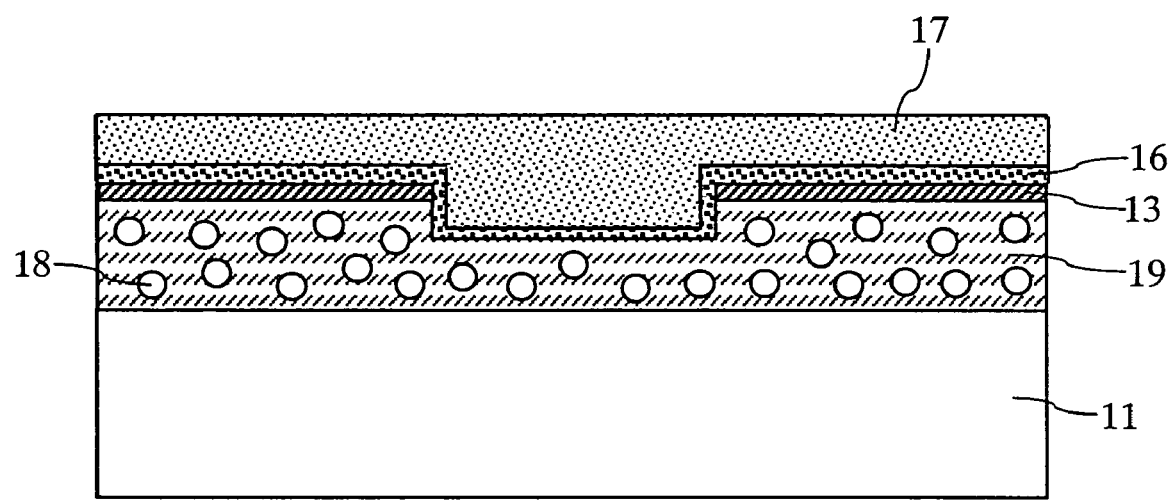
FIG. 10 is a sectional view showing a method for manufacturing a semiconductor device according to the embodiment.

FIG. 10 is a sectional view showing the state wherein a barrier-metal layer 16 and a copper layer 17 have been formed after the second heat treatment step. Specifically, the structure shown in FIG. 10 can be formed by forming the barrier-metal layer 16 on the CMP stopper film 13 and the inner surface of the trench 15, and then forming the copper layer 17 on the barrier-metal layer 16 so as to fill the trench 15.

Figure 11:
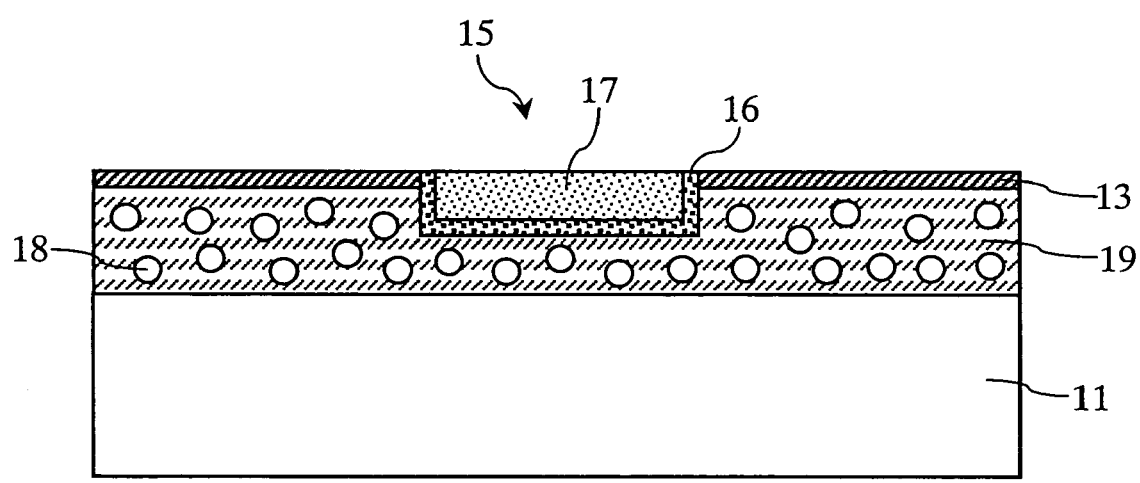
FIG. 11 is a sectional view showing a method for manufacturing a semiconductor device according to the embodiment.
Figure 12:
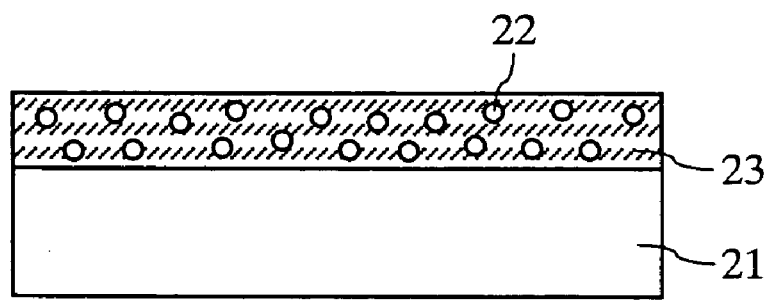
FIG. 12 is a sectional view showing a method for manufacturing a conventional semiconductor device.
Figure 13:
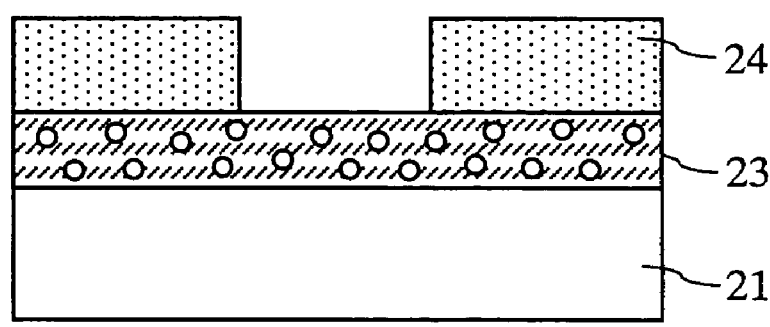
FIG. 13 is a sectional view showing a method for manufacturing a conventional semiconductor device.
Figure 14:
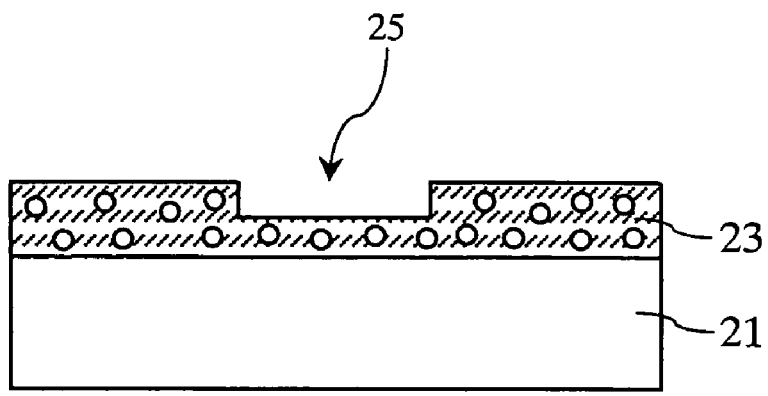
FIG. 14 is a sectional view showing a method for manufacturing a conventional semiconductor device.
Figure 15:
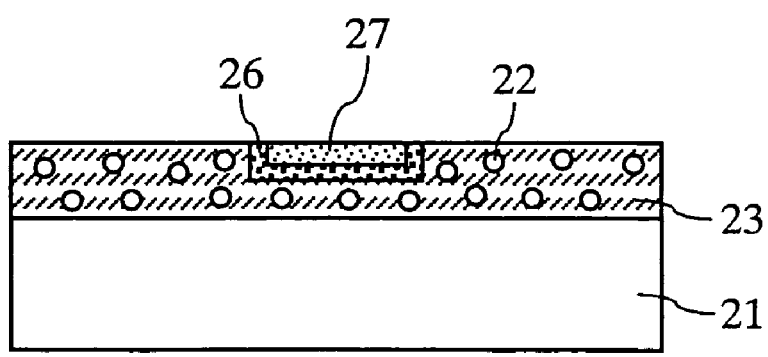
FIG. 15 is a sectional view showing a method for manufacturing a conventional semiconductor device.

As FIG. 10 shows, the non-porous insulating film 12 has been converted to a porous insulating film 19 having pores 18. From this state, the copper layer 17 and the barrier-metal layer 16 are polished using a CMP method to form the structure wherein the copper layer 17 and the barrier-metal layer 16 are buried only in the trench 15 as FIG. 11 shows. Here, polishing must be performed so as to maintain the thickness of the porous insulating film 19 within a predetermined range, and not to cause short-circuiting between wirings. However, if the speed of polishing the porous insulating film 19 is high, the polishing margin shrinks, and polishing to satisfy the above requirement becomes difficult. Since the formation of the CMP stopper film 13 on the porous insulating film 19 can secure a sufficient polishing margin regardless of the speed of polishing the porous insulating film 19, the accuracy of polishing is improved, and the occurrence of short-circuiting and the variation of wiring resistance can be reduced.

The CMP stopper film 13 is formed using an insulating material having a large selecting ratio of polishing speed with the porous insulating film 19. Specifically, the appropriate material can be selected according to the type of the porous insulating film 19, and for example, an SiC film, an $Si_xN_y$ (such as $Si_3N_4$, $Si_2N_3$ and SiN) film, an SiCN film, or an SiOC film can be used. These films can be formed using a chemical vapor deposition (hereafter referred to as CVD) method, a sputtering method, or a coating method.

The thickness of the CMP stopper film 13 can be a thickness sufficient to secure a desired polishing margin. However, since the specific dielectric constant of materials used for the CMP stopper film 13 is normally high, it is preferable that the thickness of the CMP stopper film 13 remaining after polishing is as thin as possible. For example, the CMP stopper film 13 is formed to have a thickness of 50 nm to 100 nm, and the thickness becomes 30 nm or less after the completion of polishing.

According to this embodiment, as described above, since the dry etching of the interlayer insulating film and the ashing of the resist pattern are performed in the state wherein the pore-generating material is not decomposed and vaporized, the charging damage of the interlayer insulating film by plasma can be prevented. Similarly, since cleaning is performed in the state wherein the pore-generating material is not decomposed and vaporized, the penetration of the cleaning solution into the interlayer insulating film can be prevented. Therefore, the degradation of the characteristics of the interlayer insulating film can be prevented, and a semiconductor device that excels in electrical properties and reliability can be manufactured.

According to this embodiment, since the interlayer insulating film is made porous by decomposing and vaporizing the pore-generating material, the interlayer insulating film having a low specific dielectric constant can be formed. Thereby, the parasitic capacitance between wiring layers can be lowered, and a semiconductor device that excels in electrical properties can be manufactured.

In addition, according to this embodiment, the polishing margin in the formation of the copper wiring can be widened by forming the CMP stopper film. Therefore, the accuracy of polishing can be improved and the occurrence of short-circuiting and the variation of wiring resistance can be reduced.

In this embodiment, although the example of forming a trench for the copper wiring on the semiconductor substrate is described, the present invention is not limited thereto. The present invention can be applied to any case wherein a porous insulating film is formed through a plasma treatment step or a cleaning step. For example, the present invention can also be applied to the case wherein an interlayer insulating film is formed on a semiconductor substrate on which a copper-wiring layer is formed, and a via hole or a wiring trench is formed on the interlayer insulating film using a resist pattern. The metal buried in the trench or the via hole is not limited to copper, but other metals can also be used to form the conductive layer.

The features and advantages of the present invention may be summarized as follows.

According to one aspect, as described above, since the dry etching step, ashing step and cleaning step are performed in the state wherein the first heat treatment has been performed to an insulating film composition to form a non-porous insulating film, the charging damage of the insulating film by plasma can be prevented, and the penetration of the cleaning solution into the insulating film can also be prevented. Since the non-porous insulating film is subjected to the second heat treatment to form a porous insulating film, an interlayer insulating film of a low dielectric constant can be formed.

Furthermore, according to another aspect, since the polishing margin in the formation of a copper wiring can be widened by forming a CMP stopper film, the accuracy of polishing can be improved, and the occurrence of short-circuiting and the variation of wiring resistance can be lowered.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2003-379675, filed on Nov. 10, 2003 including specification, claims, drawings and summary, on which the Convention priority of the present application is based, are incorporated herein by reference in its entirety.

The invention claimed is:

1. A method for manufacturing a semiconductor device comprising:

applying an insulating-film composition containing an insulating-film precursor and a pore-generating material onto a surface of a semiconductor substrate;

performing a first heat treatment of said insulating-film composition to polymerize said insulating-film precursor, without vaporizing said pore-generating material, to form a non-porous insulating film;

forming a resist pattern on said non-porous insulating film;

etching said non-porous insulating film using said resist pattern as a mask to form a trench in said non-porous insulating film;

removing said resist pattern by ashing;

cleaning the surface of said semiconductor substrate after the ashing;

performing a second heat treatment of said non-porous insulating film after the cleaning, thereby removing said pore-generating material from said non-porous insulating film and forming a porous insulating film;

forming a barrier-metal film on an inner surface of said trench; and filling said trench with a copper layer contacting said barrier-metal film.

2. The method for manufacturing a semiconductor device according to claim 1, including performing the first heat treatment at a temperature not exceeding 350° C.

3. The method for manufacturing a semiconductor device according to claim 1, including performing the second heat treatment at a temperature not exceeding 450° C.

4. The method for manufacturing a semiconductor device according to claim 1, wherein said porous insulating film is selected from the group consisting of a methyl silsesquioxane film, a hydrogenated silsequioxane film, an organic-inorganic hybrid film, a polyimide derivative film, a polyallyl ether derivative film, a polyquinon derivative film, and a poly-p-xylene derivative film.

5. A method for manufacturing a semiconductor device comprising:

applying an insulating-film composition containing an insulating-film precursor and a pore-generating material onto a surface of a semiconductor substrate;

performing a first heat treatment of said insulating-film composition to polymerize said insulating-film precursor without vaporizing said pore-generating material to form a non-porous insulating film;

forming a chemical mechanical polishing (CMP) stopper film on said non-porous insulating film;

forming a resist pattern on said CMP stopper film;

dry etching said CMP stopper film and said non-porous insulating film using said resist pattern as a mask to form a trench in said non-porous insulating film;

removing said resist pattern by ashing;

cleaning the surface of said semiconductor substrate after the ashing;

performing a second heat treatment of said non-porous insulating film after the cleaning, thereby removing said pore-generating material from said non-porous insulating film and forming a porous insulating film;

forming a barrier-metal film on said CMP stopper film and on an inner surface of said trench;

forming a copper layer on said barrier-metal film, filling said trench; and polishing said copper layer and said barrier-metal film by CMP to form copper wiring.

6. The method for manufacturing a semiconductor device according to claim 5, including performing the first heat treatment at a temperature not exceeding 350° C.

7. The method for manufacturing a semiconductor device according to claim 5, including performing the second heat treatment at a temperature not exceeding 450° C.

8. The method for manufacturing a semiconductor device according to claim 5, wherein said porous insulating film is selected from the group consisting of a methyl silsesquioxane film, a hydrogenated silsequioxane film, an organic-inorganic hybrid film, a polyimide derivative film, a polyallyl ether derivative film, a polyquinon derivative film, and a poly-p-xylene derivative film.

9. The method for manufacturing a semiconductor device according to claim 1, wherein said pore-generating material is selected from the group consisting of vinyl ether compounds, vinyl pyridine compounds, styrene compounds, alkyl esters vinyl compounds, acrylic acid compounds, meth acrylic compounds, and polymers including alkylene oxide units.

10. The method for manufacturing a semiconductor device according to claim 5, wherein said pore-generating material is selected from the group consisting of vinyl ether compounds, vinyl pyridine compounds, styrene compounds, alkyl esters vinyl compounds, acrylic acid compounds, meth acrylic compounds, and polymers including alkylene oxide units.

* * * * *